United States Patent
Vera et al.

(10) Patent No.: US 8,151,094 B2
(45) Date of Patent: Apr. 3, 2012

(54) DYNAMICALLY ESTIMATING LIFETIME OF A SEMICONDUCTOR DEVICE

(75) Inventors: Xavier Vera, Barcelona (ES); Jaume Abella, Barcelona (ES); Osman Unsal, Barcelona (ES); Oguz Ergin, Ankara (TR); Antonio González, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 886 days.

(21) Appl. No.: 12/086,357

(22) PCT Filed: Dec. 30, 2005

(86) PCT No.: PCT/ES2005/070188
§ 371 (c)(1),
(2), (4) Date: Jun. 11, 2008

(87) PCT Pub. No.: WO2007/077264
PCT Pub. Date: Jul. 12, 2007

(65) Prior Publication Data
US 2009/0287909 A1   Nov. 19, 2009

(51) Int. Cl.
*G06F 11/30* (2006.01)
(52) U.S. Cl. ........................................................ 712/220
(58) Field of Classification Search .................. None
See application file for complete search history.

(56) References Cited

U.S. PATENT DOCUMENTS

| | | | | |
|---|---|---|---|---|
| 3,246,242 | A | 4/1966 | M. O'Hagan, et al. | 324/767 |
| 5,867,809 | A * | 2/1999 | Soga et al. | 702/130 |
| 7,146,292 | B2 * | 12/2006 | Rossi et al. | 702/183 |
| 7,183,799 | B1 * | 2/2007 | Donlin et al. | 326/38 |
| 7,472,038 | B2 * | 12/2008 | Bose et al. | 702/182 |
| 7,493,477 | B2 * | 2/2009 | Velhal et al. | 712/220 |
| 7,495,519 | B2 * | 2/2009 | Kim et al. | 331/44 |
| 7,574,613 | B2 * | 8/2009 | Holle et al. | 713/300 |
| 7,616,021 | B2 * | 11/2009 | Papageorgiou et al. | 324/762.01 |
| 7,779,287 | B2 * | 8/2010 | Lim et al. | 713/322 |
| 2003/0078741 | A1 * | 4/2003 | Storino | 702/34 |
| 2003/0110012 | A1 | 6/2003 | Orenstien et al. | |
| 2005/0144524 | A1 * | 6/2005 | Bonaccio et al. | 714/27 |
| 2005/0237319 | A1 | 10/2005 | Ranganathan et al. | |
| 2006/0212269 | A1 * | 9/2006 | Lee et al. | 702/186 |
| 2008/0126748 | A1 * | 5/2008 | Capps et al. | 712/30 |

FOREIGN PATENT DOCUMENTS

WO     WO 00/65363     11/2000

(Continued)

OTHER PUBLICATIONS

German Patent Office, Office Action mailed Jan. 14, 2011 in German application No. 11 2005 003 788.6-35.

(Continued)

*Primary Examiner* — Eric Coleman
(74) *Attorney, Agent, or Firm* — Trop, Pruner & Hu, P.C.

(57) ABSTRACT

The present invention includes a method for obtaining dynamic operating parameter information of a semiconductor device such as a processor, determining dynamic usage of the device, either as a whole or for one or more portions thereof, based on the dynamic operating parameter information, and dynamically estimating a remaining lifetime of the device based on the dynamic usage. Depending on the estimated remaining lifetime, the device may be controlled in a desired manner.

19 Claims, 5 Drawing Sheets

FOREIGN PATENT DOCUMENTS

WO    WO 2004/012131    2/2004

OTHER PUBLICATIONS

PCT/ES2005/070188 International Search Report with Written Opinion of the International Searching Authority Mailed Dec. 30, 2005 (in Spanish).

Chinese Patent and Trademark Office, First Office Action dated Mar. 11, 2010 in Chinese patent application No. 200580052138.5.

Chinese Patent Office, Second Office Action mailed Jun. 22, 2011 in Chinese application No. 200580052138.5.

* cited by examiner

DYNAMICALLY ESTIMATING LIFETIME OF A SEMICONDUCTOR DEVICE

BACKGROUND

Embodiments of the present invention relate to semiconductor devices, and more particularly to determining an anticipated lifetime for such devices.

Measuring the lifetime of semiconductor devices (i.e., its time to failure) is a concern with current and future technologies, since transistors and other structures become smaller and degrade faster. Existing methods to predict the lifetime of such devices are static methods that assume fixed conditions for the entire device lifetime in terms of temperature, voltage and frequency. However, the dynamic behavior can be very different from the fixed conditions assumed. Additionally, each resource within an integrated circuit (IC) works under different conditions, leading to different lifetimes for different resources.

Lifetime of devices shortens from generation to generation. Furthermore, lifetime depends on actual operating parameters, such as different operating voltages and temperatures, and different technologies' scaling trends. This decreasing lifetime comes from a number of sources of degradation: electromigration, stress migration, time-dependent dielectric breakdown (TDDB), negative bias temperature instability (NBTI) and thermal cycling. The failure rate due to these factors is assumed to be distributed evenly across the five sources. This failure rate is commonly referred to as failures in time (FIT), which is the expected number of failures in $10^9$ hours. Using a FIT value one can obtain the mean time to failure (MTTF), a measure commonly used in the industry, as 1/FIT. For any technology, MTTF is obtained assuming steady state operation at fixed conditions (e.g., temperature, voltage, frequency and utilization).

However, temperature, voltage, frequency and utilization can all vary along the circuit lifetime, and thus steady state mechanisms fail to accurately predict the lifetime of devices. Accordingly a need exists for improved lifetime measurements.

DETAILED DESCRIPTION

In various embodiments, dynamic estimations of remaining lifetime of semiconductor devices, such as processors, memories controllers or other functional units may be performed. The dynamic lifetime estimations may be on a per-device (e.g., integrated circuit (IC)) basis or on a more finer-grained basis. For example, in an embodiment for use in a processor, lifetime estimations may be on a per-core basis in a multi-core processor. Still further, in other implementations, lifetime estimations may be on a per-block basis, for example, per functional unit, cache structure, register file, or other block basis.

The lifetime estimations may take into account both a device's active time, as well as time while a device is in an idle state. In such manner, an accurate estimation of remaining lifetime may be determined. As will be discussed further below, a determination of usage of the device or a so-called mileage may be performed at a periodic interval so that a lifetime estimation may accurately reflect dynamic operating conditions of the device. Furthermore, at various intervals, the determined mileage may be compared to a static estimation of the device lifetime. In this manner, an estimated remaining lifetime may be regularly determined. Using this estimated remaining lifetime, the device may be controlled in a fashion to extend its lifetime, for example, or to otherwise control the device to improve or continue its performance in light of remaining device capabilities.

Figure 1:
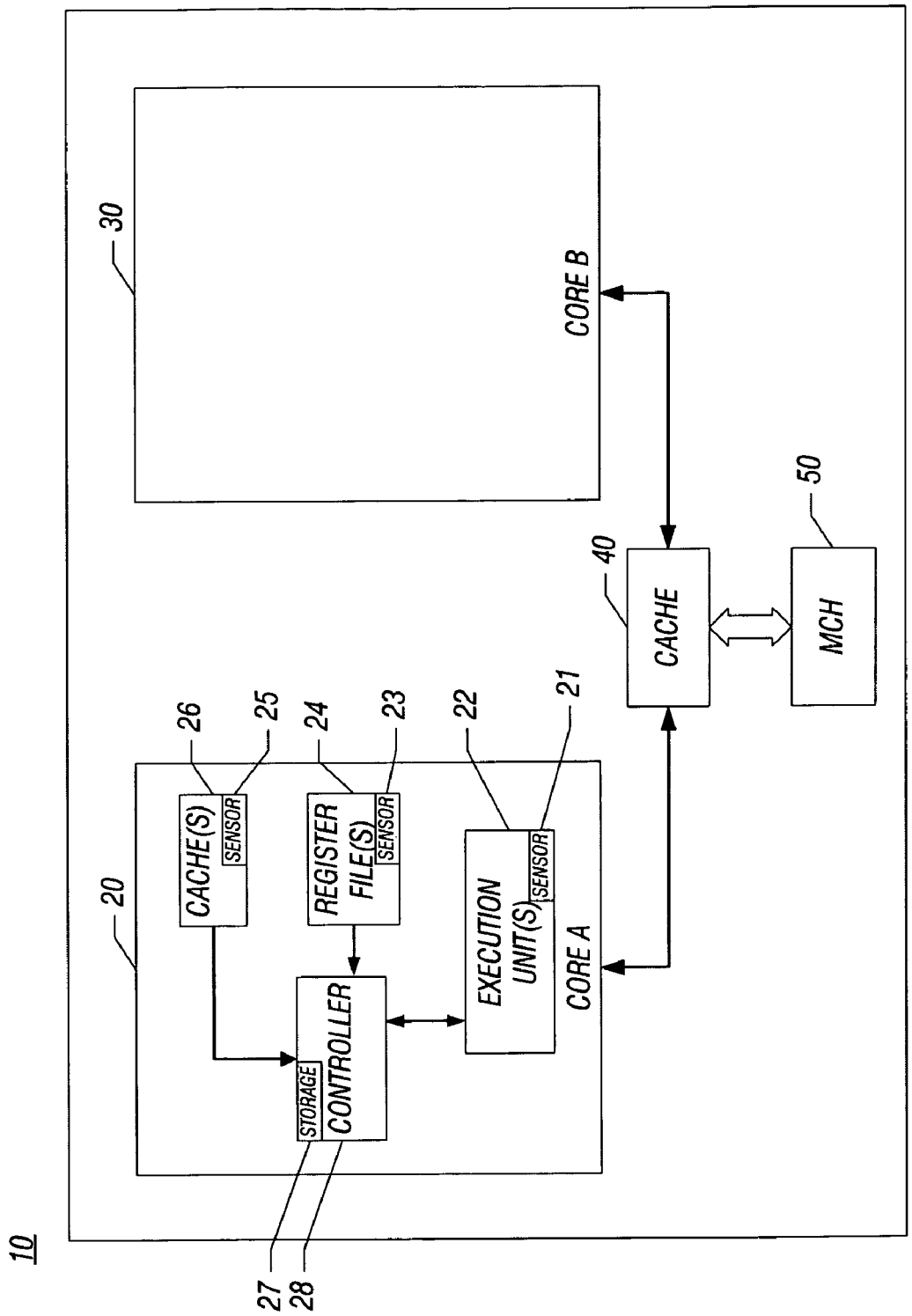
FIG. 1 is a block diagram of a processor in accordance with one embodiment of the present invention.

Referring now to FIG. 1, shown is a block diagram of a processor in accordance with one embodiment of the present invention. As shown in FIG. 1, processor 10 may be a dual-core processor having a first core (i.e., core A) 20 and a second core (i.e., core B) 30. While shown with two cores in the embodiment of FIG. 1, it is to be understood that the scope of the present invention is not so limited and in other embodiments, a single core or many-core processor may take advantage of embodiments of the present invention.

Still referring to FIG. 1, first core 20 is shown to include various blocks including one or more execution units 22, one or more register files 24 and one or more caches 26. Of course, a given core architecture may include additional blocks such as memory-like structures (register files, caches, queues, and the like) and other combinatorial circuits (execution units, decode logic, and the like). In various embodiments, execution units 22 may take various forms and may include, for example, one or more scalar processing units, such as an integer unit and a floating point unit. Furthermore, one or more single instruction multiple data (SIMD) units may be present, along with other functional units such as address generation units and the like. Furthermore, first core 20 includes a controller 28 which may be, for example, a microcontroller. Controller 28 may be used to perform dynamic lifetime estimation methods in accordance with an embodiment of the present invention. Still further, in some embodiments controller 28 may also control at least operation of execution units 22 based on a determined estimated remaining lifetime, as will be discussed further below.

First core 20 further includes a plurality of sensors to measure operating parameters of the core. In the embodiment shown in FIG. 1, each block includes its own sensor. Accordingly, sensor 21 is associated with execution units 22, sensor 23 is associated with register files 24, and sensor 25 is associated with caches 26. While shown with these associated sensors, it is to be understood that more or fewer sensors may be present in different implementations. Furthermore, the sensors may be the same or different types. For example, in one embodiment each of these sensors may be a temperature sensor such as a diode-based sensor. In other embodiments, additional operational parameter sensors, such as current sensors, voltage sensors and the like may also be present.

As further shown in FIG. 1, controller 28 includes a storage 27 which may be, for example, a non-volatile memory to store dynamically determined lifetime estimate information. Furthermore, in some embodiments storage 27 may include microcode to perform dynamic lifetime measurement methods in accordance with an embodiment of the present invention. In such embodiments, if controller 28 does not include independent logic to compute mileage, controller 28 may control operation of one or more of execution units 22 to perform the microcode.

Processor 10 further may include a cache memory 40 coupled to both cores. In turn, cache memory 40 may be coupled to a memory controller hub (MCH) 50 which provides for control and communication between cache memory 40 and other portions of a memory hierarchy, such as a system memory to which processor 10 is coupled. While not shown for ease of illustration in FIG. 1, it is to be understood that second core 30 may include similar structures such as that shown in first core 20.

Of course other implementations are possible. For example, instead of a dedicated controller within each core, a single controller may be present within a processor to receive operating parameter information from multiple cores and to determine an estimated remaining lifetime based therefrom. Still further, in some embodiments controller 28 may include its own processing capabilities to determine an estimated remaining lifetime from the information it receives from the various sensors. However, in other implementations controller 28 may instead control a pipeline of its associated core to clear out pending operations and to provide code for execution on the core's resources to enable dynamic measurement of estimated remaining lifetime. While described herein in a multi-core environment, embodiments of the present invention may be applied to any device whose temperature, voltage and frequency are monitored.

Figure 2:
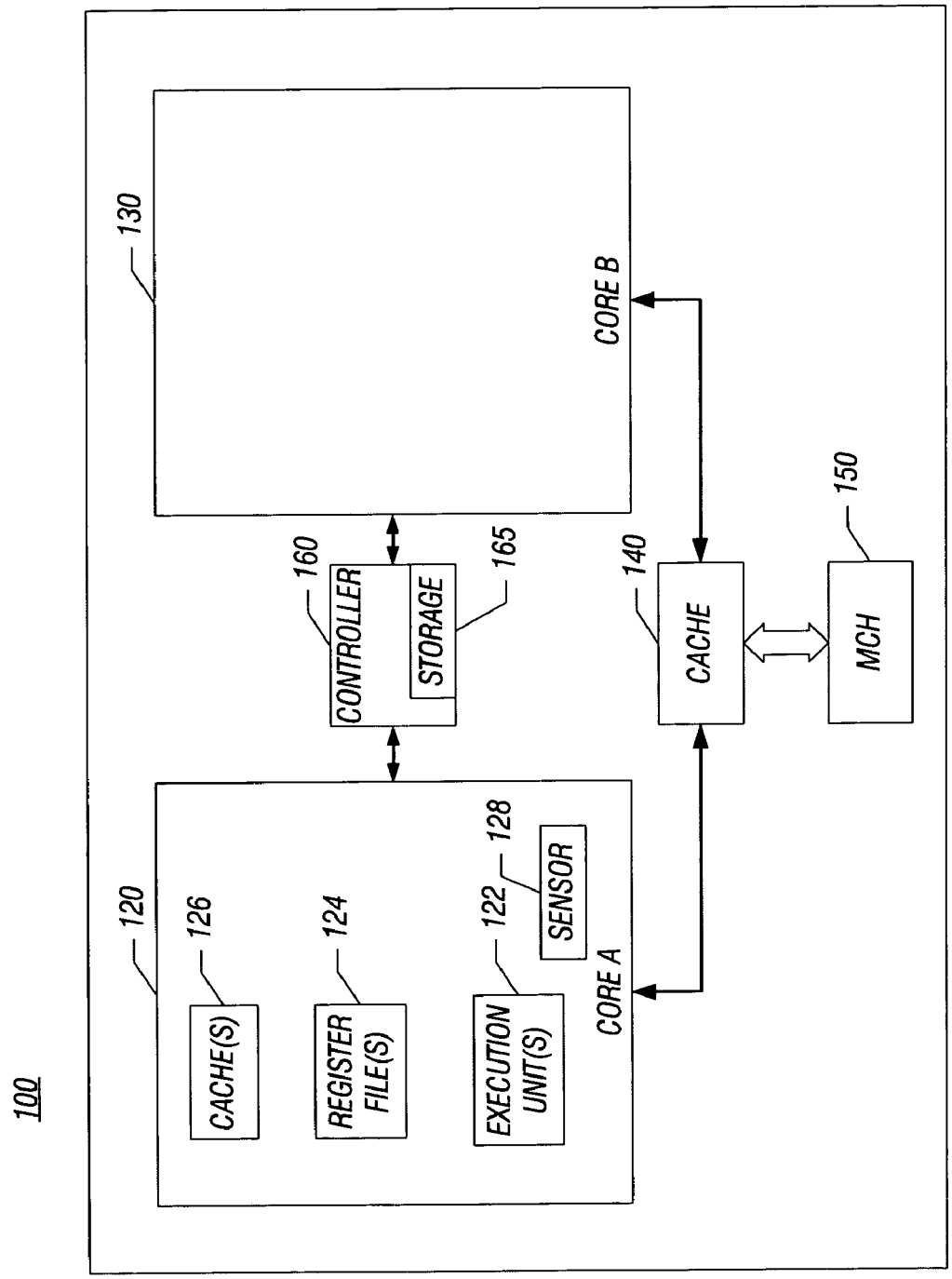
FIG. 2 is a block diagram of a processor in accordance with another embodiment of the present invention.

Referring now to FIG. 2, shown is a block diagram of a processor in accordance with another embodiment of the present invention. As shown in FIG. 2, processor 100 may again be a multi-core processor, and more particularly a dual-core processor. In this embodiment, however, a dedicated controller 160 is present to handle determination of estimated remaining lifetime for resources within processor 100.

As shown in FIG. 2, processor 100 includes a first core (i.e., core A) 120 and a second core (i.e., core B) 130. Additionally, similar to that described above with respect to FIG. 1, processor 100 includes a cache memory 140 coupled to the cores, which in turn is coupled via a MCH 150 to, e.g., a front-side bus (FSB) of a system in which processor 100 is located. In other embodiments, processor 100 may be coupled to other components such as memories, chipsets or the like via one or more point-to-point interconnects.

First core 120 includes one or more execution units 122, one or more register files 124 and one or more caches 126. While shown with these particular blocks in the embodiment of FIG. 2, it is to be understood that more or differently arranged blocks may be present in other embodiments. Furthermore, first core 120 includes a sensor 128, which may be a single sensor to measure operating parameters of first core 120. For example, sensor 128 may be a temperature sensor to measure a temperature of the core. Of course in other implementations, additional sensors may be present within first core 120, including sensors located within the various functional blocks or in close relation thereto. Second core 130 may include similar components.

In the embodiment of FIG. 2, controller 160 may thus receive operating parameter information from sensor 128 and one or more similar sensors located in or associated with second core 130. Based on this information, controller 160 may determine an estimated remaining lifetime for each of the cores. Such independent determinations may also be combined to provide information regarding the entirety of processor 100. Controller 160 may further include a storage 165, which may be a non-volatile storage to store current information regarding mileage and estimated remaining lifetime. Alternately, such information may be stored in another location of a system, e.g., another non-volatile storage.

Note that while FIGS. 1 and 2 show particular configurations of controllers and associated sensors, it is to be understood that in different embodiments the location of the controller is independent of the location of the sensors. Thus in some embodiments there may be a single on-core sensor and an associated on-core controller. Alternately, multiple on-core sensors may be associated with an off-core controller. These and other such configurations of controllers and sensors are contemplated by various embodiments of the present invention.

Figure 3:
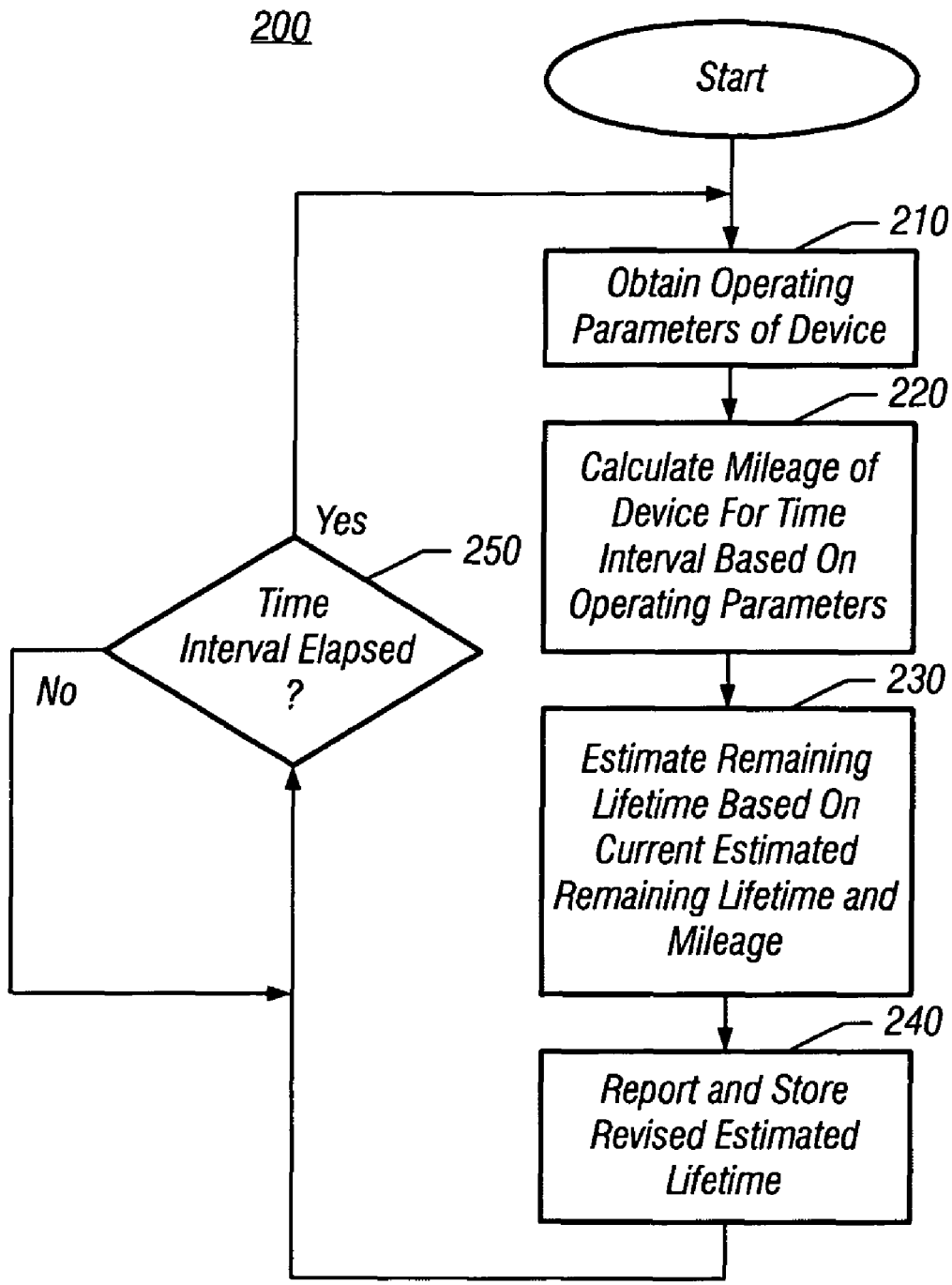
FIG. 3 is a flow diagram of a method in accordance with one embodiment of the present invention.

Referring now to FIG. 3, shown is a flow diagram of a method in accordance with one embodiment of the present invention. As shown in FIG. 3, method 200 may be implemented, for example, by a controller such as a microcontroller to implement remaining lifetime estimations. Alternately, method 200 may be implemented via instructions executed by a general-purpose processor, e.g., a processor for which the lifetime estimations are made.

Method 200 may begin by obtaining operating parameters of a device (block 210). For example, with respect to an embodiment for use in a semiconductor device such as a processor, one or more operating parameters may be obtained. These operating parameters may include, for example, actual temperature, voltage and operating frequency, although other operating parameters such as humidity, atmospheric pressure, salinity, strong electromagnetic field, radiation, acceleration are also possible. In some embodiments, voltage and frequency may be obtained based on the known information at which the processor is operating, rather than sensors for these parameters. Accordingly, in some embodiments only temperature sensors are used to provide corresponding operating parameter information. Next, a mileage of the device may be calculated for a given time interval based on the operating parameters (block 220). That is, an actual mileage or wearout based on actual use of the device may be calculated. Different manners of measuring such wearout may be performed. More so, the time interval at which this calculation is made can vary. In some implementations, the time interval may be relatively long with respect to machine cycles but relatively short in real-time parameters. For example, the time interval may vary between approximately 1.0 millisecond (ms) and 1 minute, although the scope of the present invention is not limited in this regard. In such short amounts of real-time, it is unlikely that substantial temperature, voltage or frequency changes will occur.

Using the calculated mileage, an estimated remaining lifetime may be determined based on the current estimated remaining lifetime and the calculated mileage (block 230). That is, a current estimated lifetime that exists for the system may be compared with the mileage incurred over the last time interval. The current estimated lifetime may correspond to a steady state estimated lifetime for the device (e.g., a total lifetime) minus all accumulated mileage determinations (e.g., a total mileage). Thus, the current mileage may be subtracted from the current estimated lifetime to obtain a new estimated remaining lifetime. This information may then be reported and stored (block 240). For example, the information may be stored in a non-volatile storage of the processor itself, or may be stored in another non-volatile storage of a system.

Still referring to FIG. 3, next it may be determined whether the time interval has elapsed (diamond 250). If not, diamond 250 loops back on itself. If instead the time interval has elapsed, control passes back to block 210 discussed above. In this manner, periodic measurements of actual mileage may be made and a remaining estimated lifetime may be continually updated and reported for use in control mechanisms as will be discussed further below. Of course, other manners of estimating remaining lifetime can be accommodated.

Based on remaining estimated lifetime, a system may be controlled to adjust its performance characteristics, operating parameters or task management accordingly. For example, if one or more cores of a processor are determined to be nearing the end of their estimated lifetime, such processors may be disabled or the cores may have their frequency and/or voltage modified. In other embodiments, a system may choose to send work to such a processor to fully consume its resources before its lifetime terminates. Or tasks may be steered away from such processors. Thus different manners of such control are possible in different embodiments.

Figure 4:
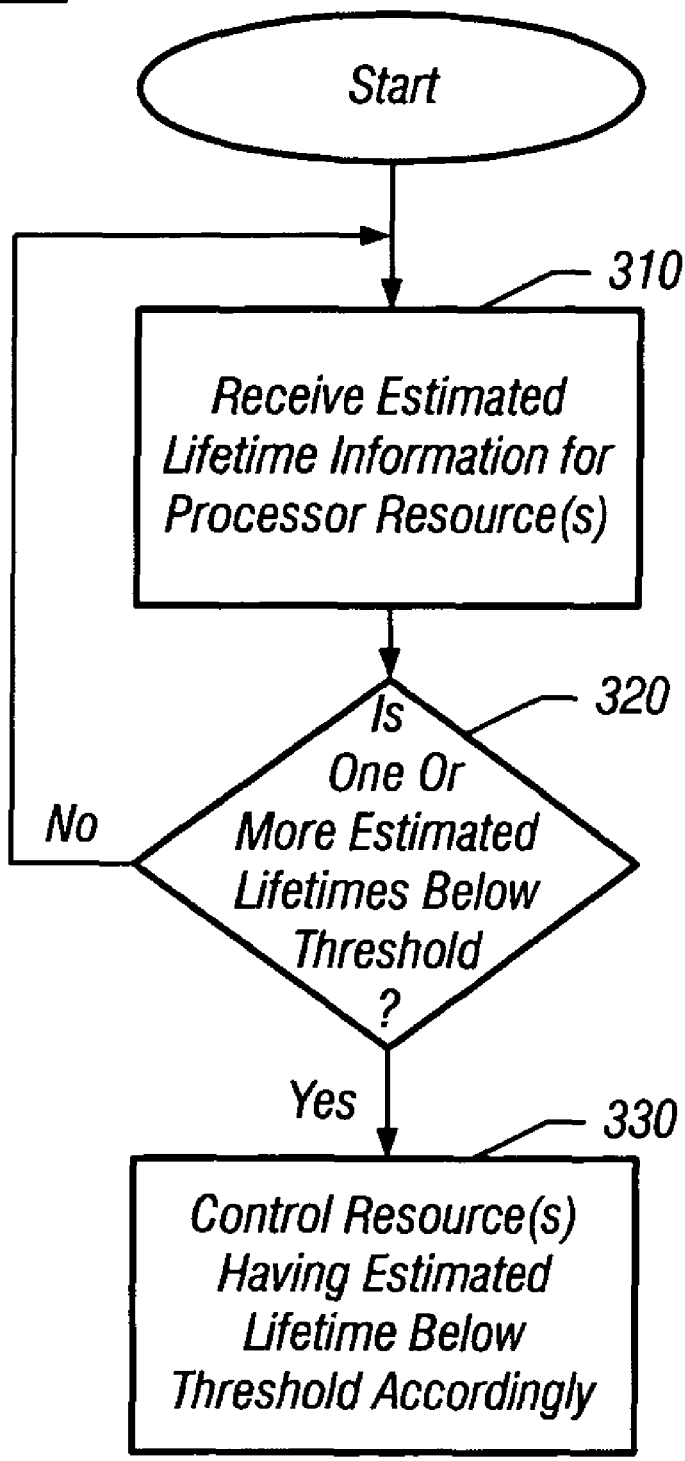
FIG. 4 is a flow diagram of controlling a resource in accordance with one embodiment of the present invention.

Referring now to FIG. 4, shown is a flow diagram of controlling a resource in accordance with one embodiment of the present invention. As shown in FIG. 4, method 300 may begin by receiving estimated lifetime information for one or more processor resources (block 310). For example, a scheduler (e.g., associated with an operating system (OS) or processor scheduler) may receive estimated lifetime information in accordance with method 200 described above with regard to FIG. 3.

Based on this estimated lifetime information, it may be determined whether one or more estimated lifetimes (e.g., of different processor resources) are below a predetermined threshold (diamond 320). The thresholds may be set at differing levels, ranging widely in various embodiments. If the values of the lifetimes are not below the threshold, control may pass back to block 310, where the method waits for a next receipt of estimated lifetime information.

If instead at diamond 320 it is determined that at least one of the lifetime estimates is below the threshold, control may pass to block 330. There, the resource(s) associated with the diminished estimated lifetime may be controlled accordingly (block 330). For example, as discussed above such processor resources, e.g., an entire processor, a core or block thereof, may be disabled or may operate at reduced voltage and/or frequencies, among other such control mechanisms. While described with this particular implementation in the embodiment of FIG. 4, it is to be understood that the scope of the present invention is not so limited.

In order to determine the remaining lifetime of a block, in various embodiments static and dynamic information may be combined. In some embodiments the static information may correspond to a steady state MTTF determined to obtain an expected lifetime for a block. In one embodiment, a steady state model may be used to determine a given lifetime (MTTF$_{steady}$) based on static temperature (T$_{base}$) and voltage (V$_{base}$) parameters, where temperature is measured in Celsius or Kelvin degrees. More specifically, in this embodiment the MTTF$_{steady}$ for an entire semiconductor device may be determined as follows:

$$MTTF_{steady} = \frac{1}{\lambda_{total}} = \frac{1}{\sum_{i=1}^{j}\sum_{l=1}^{k}\lambda_{il}} \quad [\text{Eq. 1}]$$

where $\lambda_{total}$ corresponds to a total failure rate of a semiconductor device, e.g., a processor, and $\lambda_{il}$ is the failure rate of the i$^{th}$ structure due to the l$^{th}$ failure mechanism. Accordingly, a total failure rate for a processor may be determined by summing individual failure rates for various components thereof. Thus, the total failure rate may be considered a sum-of-failure-rates model that combines the effects of different failure mechanisms across the different structures or blocks of a processor. While in various embodiments, these total failure rates may be estimated and used on a per-block basis, it is also possible to measure and analyze estimated lifetimes of finer-grained structures within a processor or other semiconductor device. Furthermore, it is to be understood that in various embodiments, different models to account for the different failure mechanisms may be implemented in determining the failure rates across the different structures.

Then, a series of equations may be used to compute the actual mileage of the block. This actual mileage or usage of the block may be based on both dynamic information as well as static information used in determining the steady state expected lifetime to thus account for dynamic differences based on actual block usage. While different manners of calculating mileage may be performed, in some embodiments a plurality of equations may be used to calculate mileage based on different environmental parameter values observed for a block to be analyzed.

First, an on-time mileage equation may be used to measure the mileage when the device (e.g., a given block of a processor) is active. Specifically, Equation 2 may be used, in some embodiments:

$$\text{MileageOn} = \Sigma(\Delta t K T \text{on}^{(Tnow-Tbase)} \cdot K V \text{on}^{(Vnow-Vbase)} \cdot K F \text{on}^{(Fnow-Fmax\_this\_V)/Fmax\_this\_V)} \quad [\text{Eq 2}]$$

With respect to Equation 2, $\Delta t$ is the time interval between two observations (i.e., a previous and current observation). KTon, KVon and KFon are technology-dependent constants related to temperature, voltage and frequency respectively, for the periods when the device is on. For various technologies (e.g., 65 nm, 45 nm and 32 nm), these constraints may always be greater than one, which means that the higher the temperature, voltage or frequency, the larger the mileage is.

Table 1 shows the values for the constants used in computing mileage in accordance with one embodiment. In other implementations, other constant values may be used, as determined based on known technology parameters and/or experimental models.

TABLE 1

|       | 65 nm  | 45 nm  | 32 nm   |
|-------|--------|--------|---------|
| KTon  | 1.0648 | 1.0679 | 1.0703  |
| KVon  | 3.5794 | 6.5925 | 10.4596 |
| KFon  | 1.3166 | 1.5016 | 1.6955  |
| KToff | 1.0696 | 1.0696 | 1.0696  |

The current variables Tnow, Vnow and Fnow correspond to temperature, voltage and frequency observed in this time period, respectively. The values V$_{base}$ and T$_{base}$ correspond to steady state measures of temperatures and voltage, respectively. Finally, F$_{max\_this\_V}$ corresponds to a maximum frequency possible for operation at a given supply voltage at which the device is operating. Note that the current mileage value determined in Equation 2 is summed with all previous such values to obtain the total active-time mileage for the device.

Second, an idle time mileage equation may be used to measure mileage for those intervals when the device (e.g., a given block of a processor) is idle. In such intervals, there is degradation only due to stress migration and thermal cycling, but the device does not degrade due to electromigration, TDDB and NBTI, for example. Since degradation may be evenly distributed across a number of sources of failure and only some of them actually degrade the device when it is idle, a scaling factor may be used. Specifically, with respect to the Equation 3, below a scaling factor of ⅖ may be used:

$$\text{MileageOff} = \Sigma(\Delta t \cdot 2/5 \cdot KT\text{off}^{(Tnow-Tbase)}) \quad [\text{Eq. 3}]$$

where KToff (similar to KTon) is a technology dependent constant related to temperature for periods when the device is idle. $\Delta t$, Tnow, and Tbase are the same as for Equation 2. Note that the current mileage value determined in Equation 3 is summed with all previous such values to obtain the idle-time mileage for the device.

The total mileage for the device may be computed based on the sum of Equation 2 and Equation 3.

$$\text{Mileage} = \text{MileageOn} + \text{MileageOff} \quad [\text{Eq. 4}]$$

Finally, in this embodiment, the estimated remaining lifetime may be determined by comparison of the steady state value to the mileage value determined in Equation 4.

$$\text{MTTF}_{remaining} = \text{MTTF}_{steady} - \text{Mileage} \quad [\text{Eq. 5}]$$

Accordingly, the mileage determined in Equation 4 accounts for the real degradation considering the actual temperature ($T_{now}$) and voltage ($V_{now}$). For instance, working for 1 hour with a temperature 10 degrees over $T_{base}$ may degrade a block as if it had been working for 1.5 hours at $T_{base}$ (1.5 hours of mileage). On the other hand, working at lower temperatures (e.g., 10 degrees under $T_{base}$) may degrade the block as if it had been working for 0.5 hours at $T_{base}$. Thus the estimated remaining lifetime may be based on a static determination of estimated lifetime (e.g., determined at device manufacture) and a dynamic estimate of consumption or mileage, based on actual dynamic operating parameters. While described with this particular implementation with respect to Equations 1-5, it is to be understood the scope of the present invention is not so limited. For example in other implementations, instead of summing the mileage determinations at each interval, individual mileage determinations may be made and subtracted from an estimated remaining lifetime value that itself is based on the original estimated lifetime of the device as updated at each interval by the actual consumption for the interval. Of course still other implementations are also possible.

To effect calculations in accordance with an embodiment of the present invention, the dynamic mileage of one or more devices may be recorded. In general, the amount of data to store mileage may be relatively small. For instance, in a many-core environment to keep track of the mileage of each core, only a few bytes may be used for each core. This information may be recorded in a non-volatile storage so that various mileage consumptions determined for a semiconductor device can be accumulated. These accumulations and the storage therefor may be at various levels of granularity. For example, in an embodiment in which different processor resources have independent mileage determinations, each such mileage determination has a corresponding location in memory. Alternately, in an embodiment in which a more coarsely-grained approach is used, e.g., a per-core basis, each core may have a dedicated memory therefor. Furthermore, in some embodiments, an estimated remaining lifetime may also be stored and later used in further estimation of the remaining lifetime (i.e., at ongoing intervals). One may save this information in basic input/output system (BIOS) or in a small non-volatile memory that cannot be accessed by a user. Note that in various embodiments, the backup of the mileage to this memory may be done periodically to save energy (e.g., every several minutes). Updating the mileage is inexpensive as embodiments of the present invention perform very few calculations during each time interval. Thus data from one or more environmental sensors may be read and mileage updated very often (e.g., every 1 millisecond, every minute or a like interval).

In different embodiments, calculations may be done in many different ways, all with negligible impact in area and energy consumption. For instance, in a many-core environment the following are possible options. In one embodiment, a microcontroller shared among all cores may be present to compute the mileage of each core or portions thereof, such as controller 160 of FIG. 2. This microcontroller may include one or more logic blocks to make the desired calculations. When a system including such a processor is turned on, the microcontroller may load the mileage information from a non-volatile memory, and at every $\Delta t$ obtain the data from sensors for each core to update their mileage and restore the same.

Instead of having a global microcontroller, each core may include its own microcontroller with its own logic to compute the mileage. Alternately, each core may have its own microcontroller that stalls the instruction fetch of the core, waits for the pipeline to be empty, injects the required instructions to compute the mileage, saves the results in its own registers, and finally, resumes the execution of the currently running program.

Thus, using embodiments of the present invention, accurate lifetime predictions of devices may be effected, enabling the device itself or any software on top of it to be disabled/migrated before the device is predicted to die. Measuring the mileage of cores in a many-core environment may allow for steering policies for tasks. For instance, one may steer tasks to the least or most used cores, depending on a desired implementation. Further, measuring the mileage enables the use of mechanisms that reduce the performance of devices when their wearout is high in order to extend their lifetime. For example when a mileage determination reaches a predetermined threshold, reduced performance of a device may be implemented. Such reduced performance may be effected via lowering of operating voltage and/or frequency, for example.

Using embodiments of the present invention, additional processor features may be enabled/disabled. For example, in some implementations, a processor may include various control logic to enable/disable certain functions or blocks based on usage. Furthermore, different pricing policies may be realized using mileage determinations. In such an implementation a processor or other semiconductor device can be shipped with a predetermined mileage. Such predetermined mileage may be stored, e.g., in a non-volatile storage of the processor or other semiconductor device. Furthermore, in some embodiments the predetermined mileage may be set at a value lower than the actual determined static lifetime. In this manner, a lower predetermined lifetime may be set for devices that are sold at a lower price point than similar devices having a higher predetermined lifetime value. In this way, processors having identical functionality may be sold at different price points depending on a preset lifetime for the device. During operation, dynamic measurements of mileage may be compared to this predetermined mileage to determine when an end of life condition has been reached. When such a condition has been reached, embodiments of the present invention may provide for disabling of the processor or other semiconductor device.

For example, in some implementations programmable fuse logic within a processor may be enabled when a calculated mileage corresponds to the predetermined mileage for the processor. Accordingly, the fuse logic may disable the processor, in any of various manners. In this way, one can set the maximum mileage allowed in accordance with the price of the device (e.g., the higher the mileage budget, the higher the price). In other implementations, a user may be provided an opportunity to be granted extra mileage, e.g., via additional payment(s).

Instead of fuse logic, in other implementations, a control register or other such control feature may be set (for example) to disable the processor or a portion thereof when the remaining lifetime meets the predetermined mileage. By using mileage to keep track of the wearout of devices, more reliable processors may be provided, as in some implementations worn-out devices can be disabled before they fail.

Figure 5:
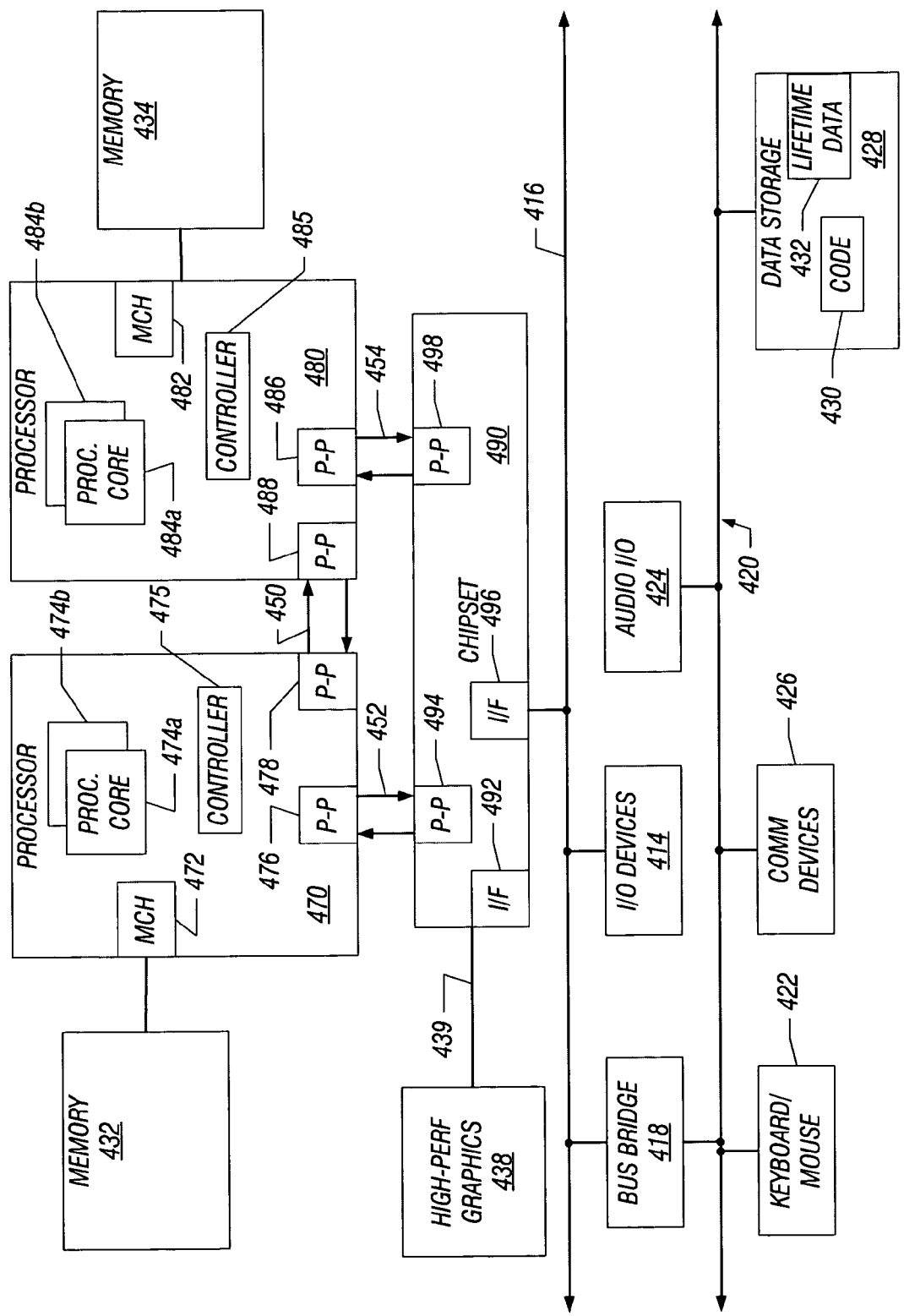
FIG. 5 is a block diagram of a multiprocessor system in accordance with an embodiment of the present invention.

Embodiments may be implemented in many different system types. Referring now to FIG. 5, shown is a block diagram of a multiprocessor system in accordance with an embodiment of the present invention. As shown in FIG. 5, the multiprocessor system is a point-to-point interconnect system, and includes a first processor 470 and a second processor 480 coupled via a point-to-point interconnect 450. As shown in FIG. 5, each of processors 470 and 480 may be multicore processors, including first and second processor cores (i.e., processor cores 474a and 474b and processor cores 484a and 484b). Each of processors 470 and 480 may further include a controller 475 and 485, respectively, to perform dynamic estimated lifetime determinations in accordance with an embodiment. In some implementations, these controllers may include storage for a predetermined mileage, as well as dynamic mileage. First processor 470 further includes a memory controller hub (MCH) 472 and point-to-point (P-P) interfaces 476 and 478. Similarly, second processor 480 includes a MCH 482 and P-P interfaces 486 and 488. As shown in FIG. 5, MCH's 472 and 482 couple the processors to respective memories, namely a memory 432 and a memory 434, which may be portions of main memory locally attached to the respective processors.

In some embodiments, an operating system (OS) of the multi-processor system may execute on top of one or more of both first processor 470 and second processor 480. The OS may include a scheduler to schedule processes on the different processors and cores thereof. In some implementations, controllers 475 and 485 may provide estimated remaining lifetime information to the OS scheduler. Using this information, the scheduler may then steer processes to/from one or the other of first processor 470 or second processor 480 or cores thereof. Furthermore, the scheduler may implement other control functions based on the estimated remaining lifetime information.

First processor 470 and second processor 480 may be coupled to a chipset 490 via P-P interfaces 452 and 454, respectively. As shown in FIG. 5, chipset 490 includes P-P interfaces 494 and 498. Furthermore, chipset 490 includes an interface 492 to couple chipset 490 with a high performance graphics engine 438. In one embodiment, an Advanced Graphics Port (AGP) bus 439 may be used to couple graphics engine 438 to chipset 490. AGP bus 439 may conform to the Accelerated Graphics Port Interface Specification, Revision 2.0, published May 4, 1998, by Intel Corporation, Santa Clara, Calif. Alternately, a point-to-point interconnect 439 may couple these components.

In turn, chipset 490 may be coupled to a first bus 416 via an interface 496. In one embodiment, first bus 416 may be a Peripheral Component Interconnect (PCI) bus, as defined by the PCI Local Bus Specification, Production Version, Revision 2.1, dated June 1995 or a bus such as the PCI Express bus or another third generation input/output (I/O) interconnect bus, although the scope of the present invention is not so limited.

As shown in FIG. 5, various I/O devices 414 may be coupled to first bus 416, along with a bus bridge 418 which couples first bus 416 to a second bus 420. In one embodiment, second bus 420 may be a low pin count (LPC) bus. Various devices may be coupled to second bus 420 including, for example, a keyboard/mouse 422, communication devices 426 and a data storage unit 428 which may include code 430, in one embodiment. Data storage unit 428, which may be a nonvolatile storage, further may include lifetime data 432 corresponding to accumulated mileage values for various resources of the system. Further, an audio I/O 424 may be coupled to second bus 420.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
obtaining dynamic operating parameter information of a processor;
determining dynamic usage of the processor based on the dynamic operating parameter information, including:
for a first time interval when the processor is operating, performing a first calculation using the dynamic operating parameter information for the first time interval and static operating parameter information used to determine steady state expected lifetime of the processor to obtain a dynamic active usage of the processor;
for a second time interval when the processor is idle, performing a second calculation using a portion of the dynamic operating parameter information for the second time interval, a portion of the static operating parameter information, and a scaling factor to obtain a dynamic idle usage of the processor; and
dynamically estimating a remaining lifetime of the processor based on the dynamic usage.

2. The method of claim 1, further comprising controlling the processor based on the estimated remaining lifetime.

3. The method of claim 1, further comprising determining a total usage of the processor based on the dynamic active usage and the dynamic idle usage.

4. The method of claim 2, wherein controlling the processor comprises steering one or more processes to a selected core of a plurality of cores of the processor based on the estimated remaining lifetime.

5. The method of claim 4, further comprising steering the one or more processes to a least used core or a most used core of the processor.

6. The method of claim 3, further comprising comparing the total usage to an estimated lifetime of the processor to dynamically estimate the remaining lifetime.

7. An apparatus comprising:
a processor including:
at least one resource to perform instructions;
at least one environmental sensor; and
logic coupled to the at least one environmental sensor to determine an actual consumption of the at least one resource based on information from the at least one environmental sensor using an active consumption determined according to a first calculation that relates observed temperature, voltage and frequency to steady state temperature and voltage and maximum frequency, and an inactive consumption determined according to a second calculation that relates observed temperature to the steady state temperature according to a scaling factor, wherein the inactive consumption corresponds to time periods in which the at least one resource is inactive.

8. The apparatus of claim 7, further comprising a controller to control the processor based upon an estimated remaining lifetime determined using the actual consumption.

9. The apparatus of claim 8, wherein the controller is to determine the estimated remaining lifetime from the actual consumption and a steady state lifetime measure.

10. The apparatus of claim 7, wherein the logic comprises a microcontroller to execute microcode on the at least one resource of the processor.

11. The apparatus of claim 8, wherein the processor includes a lifetime value corresponding to an allowed lifetime for the processor, the lifetime value stored in a non-volatile storage of the processor, and the processor includes end of lifetime logic to disable the processor when the estimated remaining lifetime substantially corresponds to the allowed lifetime, the allowed lifetime lower than an actual determined static lifetime for the processor.

12. A system comprising:
a first processor to execute instructions, the first processor including:
at least one core to perform instructions; and
at least one thermal monitor;
a first controller coupled to the at least one thermal monitor to determine an estimated remaining lifetime of the first processor using information from the at least one thermal monitor;
a second processor coupled to the first processor to execute instructions;
a second controller coupled to the first processor and the second processor to receive the estimated remaining lifetime from the first controller and to control usage of at least the first processor based on the estimated remaining lifetime; and
a dynamic random access memory (DRAM) coupled to the first processor and the second processor.

13. The system of claim 12, wherein the first processor includes a lifetime value corresponding to an allowed lifetime for the first processor, the lifetime value stored in a non-volatile storage of the first processor.

14. The system of claim 13, wherein the allowed lifetime is set to one of a plurality of different levels during manufacture of the first processor, wherein each of the plurality of different levels corresponds to a different price point for the first processor.

15. The system of claim 12, wherein the first controller is to inform the second controller of an imminent disablement of the first processor prior to disablement.

16. The system of claim 12, wherein the second controller is to steer one or more tasks away from the first processor and to the second processor based on the estimated remaining lifetime.

17. The system of claim 12, wherein the second controller is to steer one or more tasks to a most used one or a least used one of the first processor and the second processor based on a comparison of the estimated remaining lifetime of the first processor and a corresponding estimated remaining lifetime of the second processor.

18. An article comprising a non-transitory machine-readable storage medium including instructions that if executed by a machine enable the machine to perform a method comprising:
determining an actual usage of a first block of a semiconductor device at a periodic interval based on dynamic information obtained regarding the first block, including determining the actual usage according to a first calculation if the first block is active during the periodic interval and according to a second calculation if the first block is inactive during the periodic interval;
estimating a dynamic lifetime of the first block based on the actual usage and a static predicted lifetime for the first block; and
storing the actual usage in a non-volatile memory of the semiconductor device.

19. The article of claim 18, wherein the method further comprises determining the actual usage for the periodic interval and accumulating with the stored actual usage to update the stored actual usage.

* * * * *